(12) United States Patent
Letourneau (10) Patent No.: US 6,462,951 B2
(45) Date of Patent: Oct. 8, 2002

(54) SECURING HEAT SINKS TO ELECTRONIC COMPONENTS

(75) Inventor: Fabien Letourneau, Aylmer (CA)

(73) Assignee: Alcatal Canada Inc., Kanata (CA)

( * ) Notice: Subject to any disclaimer, the term of this patent is extended or adjusted under 35 U.S.C. 154(b) by 0 days.

(21) Appl. No.: 09/859,591

(22) Filed: May 18, 2001

(65) Prior Publication Data

US 2001/0028552 A1 Oct. 11, 2001

Related U.S. Application Data

(63) Continuation of application No. 09/546,906, filed on Apr. 10, 2000.

(51) Int. Cl.$^7$ ................................................. H05K 7/20
(52) U.S. Cl. ...................... 361/704; 165/185; 165/80.3; 174/16.3; 257/718; 361/710
(58) Field of Search ............... 165/80.2, 80.3, 165/185; 174/16.3; 257/706–707, 712–713, 718–719, 726–727; 361/706, 707, 709–710, 715, 717–720

(56) References Cited

U.S. PATENT DOCUMENTS

| | | | | |
|---|---|---|---|---|
| 5,109,307 A | * | 4/1992 | Miyamoto et al. | 361/704 |
| 5,784,257 A | * | 7/1998 | Tata | 361/704 |
| 5,917,703 A | * | 6/1999 | Murphy | 361/704 |
| 6,058,014 A | * | 5/2000 | Choudhury et al. | 361/704 |
| 6,191,478 B1 | * | 2/2001 | Chen | 257/718 |

* cited by examiner

*Primary Examiner*—Gregory Thompson
(74) *Attorney, Agent, or Firm*—Alfred A. Macchione (57) ABSTRACT

A clip for holding a heat sink in heat conductive engagement with an integrated circuit mounted upon a substrate. The clip has a resilient beam for extending across the heat sink and two arms to extend down opposite edges of the heat sink and the substrate. The arms have free end extensions. When assembled, the heat sink and substrate sandwich between them the integrated circuit and a compression spring forming part of the clip, compresses the heat sink, integrated circuit and substrate together between the spring and the free end extensions. The compression spring is compressed in turn between the heat sink and the beam which is resiliently flexed away from the heat sink. The clip is devoid of screwthreaded attachments together with their disadvantages and the spring is the sole means of holding the assembly together. The beam of the clip may be spaced from a base of the heat sink so as not to extend across cooling air passages between heat transfer projections of the heat sink. The clip does not cause electrical shorting. Loosening of the clip cannot take place in the assembly. The clip is registered with the heat sink and with the substrate to accurately locate the heat sink relative to the integrated circuit. Cooling air is funnelled through a space defined by the beam, a base of the heat sink and the two arms so as to pass the air through air flow passages of the heat sink.

23 Claims, 6 Drawing Sheets

SECURING HEAT SINKS TO ELECTRONIC COMPONENTS

This application is a continuation of U.S. patent application Ser. No. 09/546,906, filed Apr. 10, 2000, which is incorporated herein by reference.

FIELD OF THE INVENTION

This invention relates to the securing of heat sinks to electronic components.

BACKGROUND OF THE INVENTION

In the electronics industry, printed circuit boards form parts of electronic circuits which include electronic components carried by the boards. These components generate heat during usage. Some components, e.g. integrated circuits, require heat to be removed from them to permit operation within acceptable operating ranges of temperature, i.e. temperatures not sufficiently high to render the components non-functional. In one method of removing heat, heat sinks are used. In use, a heat sink needs to be held in heat conductive relationship with a corresponding electronic component and a heat emitting projection or projections of the heat sink are located in a cooling air flow path for removal of the heat generated by the component.

Various types of design structures are employed for securing heat sinks with bases of the heat sinks in positions in heat conductive relationship with their electronic components. In a first conventional design structure for securing a heat sink in position, a clip having a leaf spring portion is positioned with the leaf spring portion extending across the base of the heat sink. Arms at opposite ends of the leaf spring portion extend down opposite edges of the base and around a substrate to one side of which the electronic component, in the form of an integrated circuit, is attached. A screw extends in screwthreaded engagement through the leaf spring portion of the clip substantially midway between its ends. The screw is tightened against the base of the heat sink to cause the leaf spring portion to flex away from the base thereby drawing the arms inwards towards the substrate. This action causes inwardly directed free ends of the arms to engage the side of the substrate remote from the electronic component. Increased screw tightening then results in tightly holding the substrate, the electronic component and the base of the heat sink between the ends of the arms and the screw.

A problem which exists in use of the above design structure is that the screw needs to have a certain minimal length for tightening and deforming the leaf spring portion of the clip which is flexed outwards from the base of the heat sink during the tightening operation. While the heat sink itself may be sufficiently small to fit comfortably together with the substrate and integrated circuit within narrow gaps (e.g. 9 mm to 10 mm), such as provided between adjacent printed circuit boards, the minimum length of screw prevents the screw from being accommodated in such a narrow gap. This clip structure also has the disadvantage that the leaf spring portion requires space to be positioned across the base, which space could more advantageously be occupied by a heat emitting projection or projections of the heat sink. As a result, optimal heat removal and dispersion cannot be achieved. Further, another reason for detracting from optimizing heat removal and dispersion is that the leaf spring portion of the clip is arched, in its tightened position, away from the heat sink base and extends along its length across cooling air flow passages between the heat emitting projections thereby effectively reducing flow passage area and also providing a resistance to the flow of cooling air.

In addition to this, the clip is formed from an electrically conductive material, i.e. a metal. In cases where the substrate has terminals or conductors on its side remote from the electronic component (particularly in the case of a ball grid array structure on the substrate), then the ends of the clip arms in engaging the remote side of the substrate are in danger of approaching too close to the terminals or conductors. Thus, shorting of the circuitry is a possibility.

Also, the screw incorporated in the above structure offers certain weaknesses in that a specific torque is required to tighten the clip to a desired degree to provide a required compressive contact between the base of the heat sink and the electronic component. Special torque applying tools may be available for this purpose. However, actual torque applied may be at the whim of the assembler who may not, in some cases, use a torque applying tool. It is also possible that a torque applying tool is incorrectly adjusted. If insufficient torque is provided during assembly, repeated temperature cycling in use, attended by shrinkage and expansion of materials, may result in loosening of the screw and slackening in compressive contact of the heat sink base with the electronic component. Vibration may also assist in loosening of the screw. In any event, loosening of the screw results in reduction in heat removal from the electronic component and could also result in complete detachment of the clip and heat sink from the component. Alternatively, the application of too much torque during assembly could increase strain on components, particularly during temperature cycling, and may result in cracking or breaking apart of the component, substrate, or heat sink.

In a second conventional design structure, a heat sink has a screwthreaded cylindrical metal base which is screwthreadedly attached through a hole in a plastic clip as a replacement for the screw and clip design discussed above. In this second structure, one end of the base is in heat conductive contact with its corresponding heat generating electronic component. At the other end of the base, the heat sink has a heat emitting projection in the form of a radially extending heat emitting flange. This latter design is shorter than the screw and clip of the first conventional design structure discussed above and may be suitably located in narrow gaps such as those referred to above. However, the heat emitting flange needs a specific dimension radially of the screwthreaded base in order to transfer the required heat from the electronic component into the cooling air flow. Unfortunately, this results in the flange overshadowing and extending beyond the boundaries of an electronic component for which it is suitably designed. Hence, when in use, for instance upon a printed circuit board, the flange also overshadows areas of the board which could otherwise be used for circuitry or attachment of circuitry components. Thus, freedom for circuitry design becomes limited.

In addition, the screwthreaded base of the heat sink is substantially large. This results in the length of the plastic clip on either side of the base being short and limited in flexibility. This may prevent the clip from being flexed to allow the arms of the clip to move apart sufficiently to pass down opposite edges of the heat sink and substrate to allow for engagement of the inwardly extending free ends of the arms with the remote side of the substrate for holding purposes. In this case the clip needs to be slid laterally onto the substrate during assembly. To achieve this in practice, i.e. with the component and its mounting substrate upon a printed circuit board, the board needs to be free of circuitry elements adjacent an edge of the substrate which first receives the clip. This provides a further limitation to freedom for circuitry design upon the printed circuit board.

Also, because of the need for lateral application of the clip, positioning of the clip upon the electronic component relies entirely upon the judgment of the assembler. If the clip, and thus the heat sink, are not correctly positioned, this could reduce heat removal from the component.

In addition, while the latter heat sink and clip design may be located within minimally narrow gaps, the heat emitting flange may not provide sufficient distance from an adjacent article (e.g. printed circuit board) to ensure an adequate cooling air flow across the flange for the required cooling purposes. Further to this, the clip of this second conventional design structure provides cooling air flow passage obstruction problems and potential screw loosening problems similar to those discussed above with regard to the first conventional design structure. In the second design structure, plastic creep and stress relaxation also increase the possibility of screw loosening.

SUMMARY OF THE INVENTION

The present invention seeks to provide a clip for securing a heat sink to a heat generating electronic component and also a clip, heat sink and electronic component combination in which at least some of the above disadvantages are reduced or minimized.

According to one broad aspect, the invention provides a clip for holding a heat sink in heat conductive relationship with an electronic component mounted upon a first side of a substrate, the clip comprising a clip body and spring means, the clip body comprising:

- a resilient beam for location in a position on one side of the heat sink; and
- two arms extending in opposition from the beam in spaced positions along the beam, each arm having a free end with an electrically non-conductive free end extension which extends towards the other arm;
- the clip body being resiliently flexible to move the free ends of the arms further apart for reception of the heat sink and the substrate between them and locate the free end extensions in positions opposing a second side of the substrate remote from the first side; and
- the spring means is operably engageable with the resilient beam in a position between the arms to act between the beam and a surface of the heat sink so as to resiliently flex the beam away from the heat sink and pivot the arms to move their free end extensions towards each other on the second side of the substrate to compressively hold the heat sink, electronic component and substrate between the spring means and the free end extensions of the arms.

Clips according to the invention have certain distinct advantages.

In a case where an inventive clip together with a heat sink is used with a specific integrated circuit on a substrate, the clip and heat sink may lie substantially within the boundary lines of the substrate with the heat sink and substrate lying between the arms. Also, the clip may be applied directly down towards a side of the electronic component thus obviating the need for lateral sliding movement of the clip and the heat sink onto the component and substrate. Hence, it follows that a printed circuit board upon which the substrate is mounted may have circuitry including electronic components located in regions of the board adjacent to the substrate as the clip and heat sink will not overshadow these adjacent regions. Further, because the spring means is locatable between the beam of the clip and a surface of the heat sink, then the beam is located furthest from the heat sink.

Hence, the beam may be positioned outwardly beyond any heat emitting projections of the heat sink or may overlie free end extremities of such projections. Thus the beam will not obstruct the most effective heat transfer parts of the seat sink, i.e. the parts of the projections which lie closest to a base of the heat sink and which become hotter in use than the extremities.

As the free end extensions of the arms of the clip have electrically insulated surfaces, then shorting of electrical terminals on the second side of the substrate by close proximity with these surfaces is avoided.

A clip of the invention, in having spring means, avoids the use of a screwthread attachment, thereby also avoiding loosening of the clip, for instance as caused by temperature cycling which may undo the screw. Also, clips of the invention may be designed suitable to provide a combined assembly height with heat sink, electronic component and substrate, to fit comfortably within narrow gaps, e.g. 9 mm to 10 mm, while having negligible or no effect upon flow of cooling air through passages between the projections of the heat sink.

In a preferred arrangement, the clip is formed with integral beam and arms and is made entirely from an electrically insulating material, i.e. a suitable plastic. Such a plastic is a polyethylerimide. However, should creep occur in the plastic, the spring means will compensate for this and maintain the required degree of compressive contact between the heat sink and the electronic component with no loosening effect. Also, the spring means has a spring rate which is predetermined by design to suit its function. Hence, compressive force of contact between the heat sink and electronic component is as required to optimize heat exchange. Continuous pressure is applied during dimensional changes due to temperature changes and the effects of different thermal coefficients of expansion. Hence the need for specific torque in tightening of a screw or as decided at the whim of the assembler is avoided.

With the arms of the clip locating the heat sink and substrate between them and with the resilient beam located at or outwardly of the free extremities of the heat emitting projections, the beam and arms define boundaries to air flow passages provided between the projections. Leading edges of the beam and arms (i.e. in the direction of movement of cooling air) may suitably be oriented to encourage or direct the air into the flow passages.

It is also preferable that the metal spring means comprises at least one compression spring which is locatable with its ends engaged with the resilient beam and with the heat sink. Other forms of spring means may be used, for instance a leaf spring, with the disadvantage that it may obscure air flow passages. The compression spring, however, may be located in a position in alignment with heat emitting projections of the heat sink so as to provide negligible or no obstruction to the air flow passages.

It is also preferable that a surface of the resilient beam, which faces away from and remote from the arms, is concave in an unstressed condition of the beam. Resilient flexing of the beam in use will tend to reduce the concavity of this surface and preferably without the surface increasing the effective height of the clip.

The invention further includes a combination of a substrate, an electronic component mounted upon a first side of the substrate, a heat sink and a clip for holding the heat sink in heat conductive relationship with the electronic component. The clip is as defined according to the invention above.

BRIEF DESCRIPTION OF THE DRAWINGS

One embodiment of the invention will now be described, by way of example, with reference to the accompanying drawings, in which.

DESCRIPTION OF PREFERRED EMBODIMENT

Figure 1:
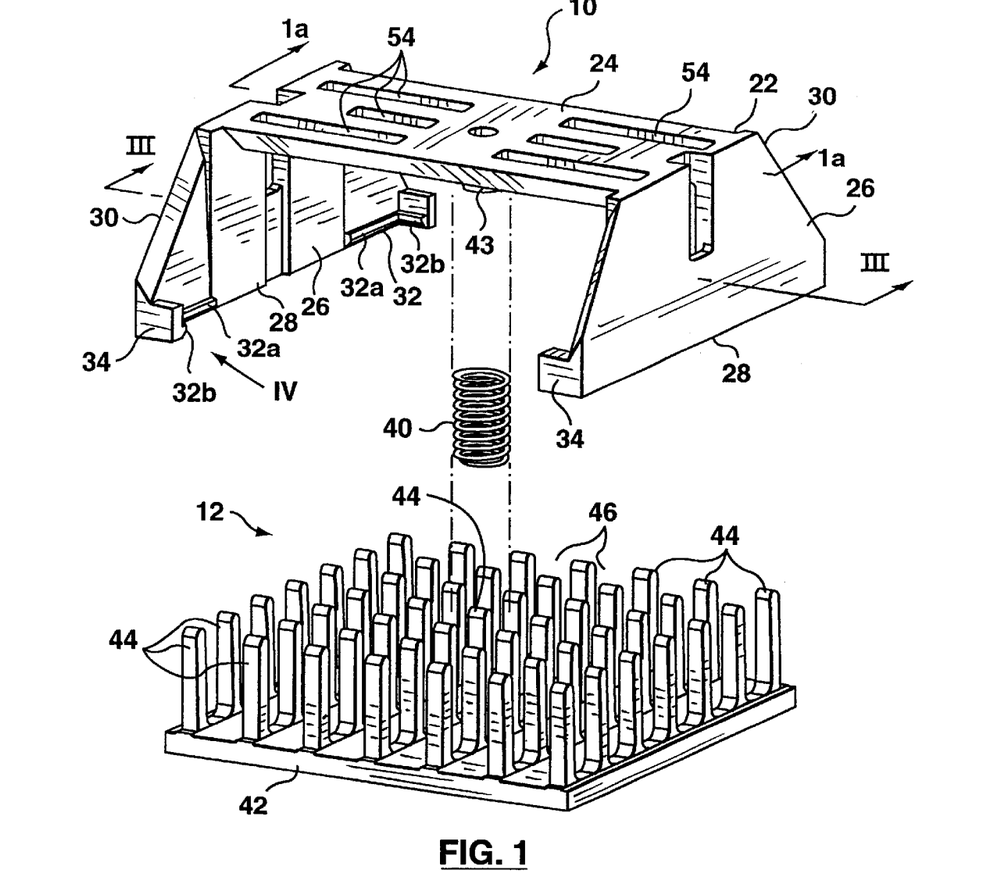
FIG. 1 is an exploded isometric view of a clip according to the embodiment and a heat sink.
Figure 2:
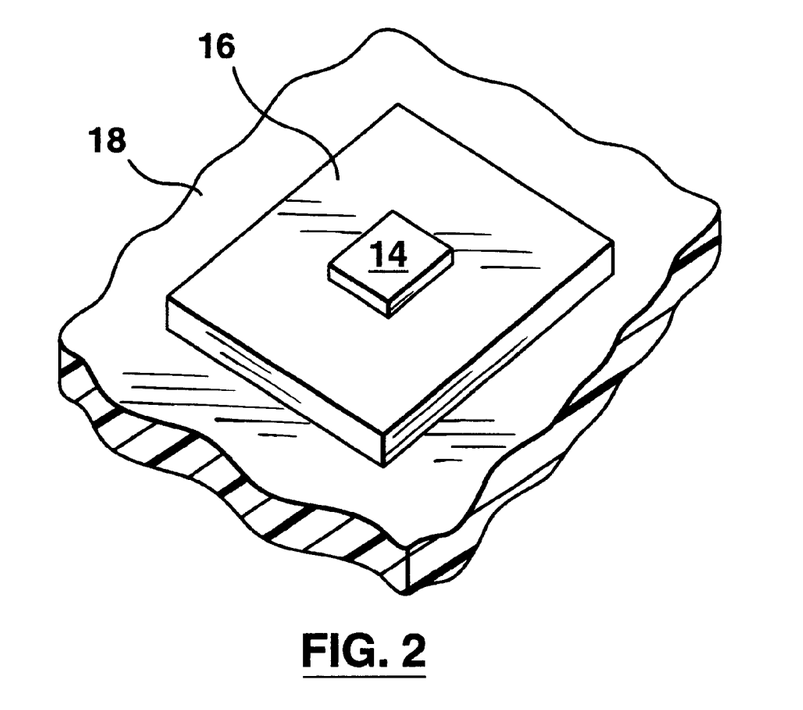
FIG. 2 is an isometric view of a substrate and electronic component mounted upon a printed circuit board, part only of which is shown.
Figure 5:
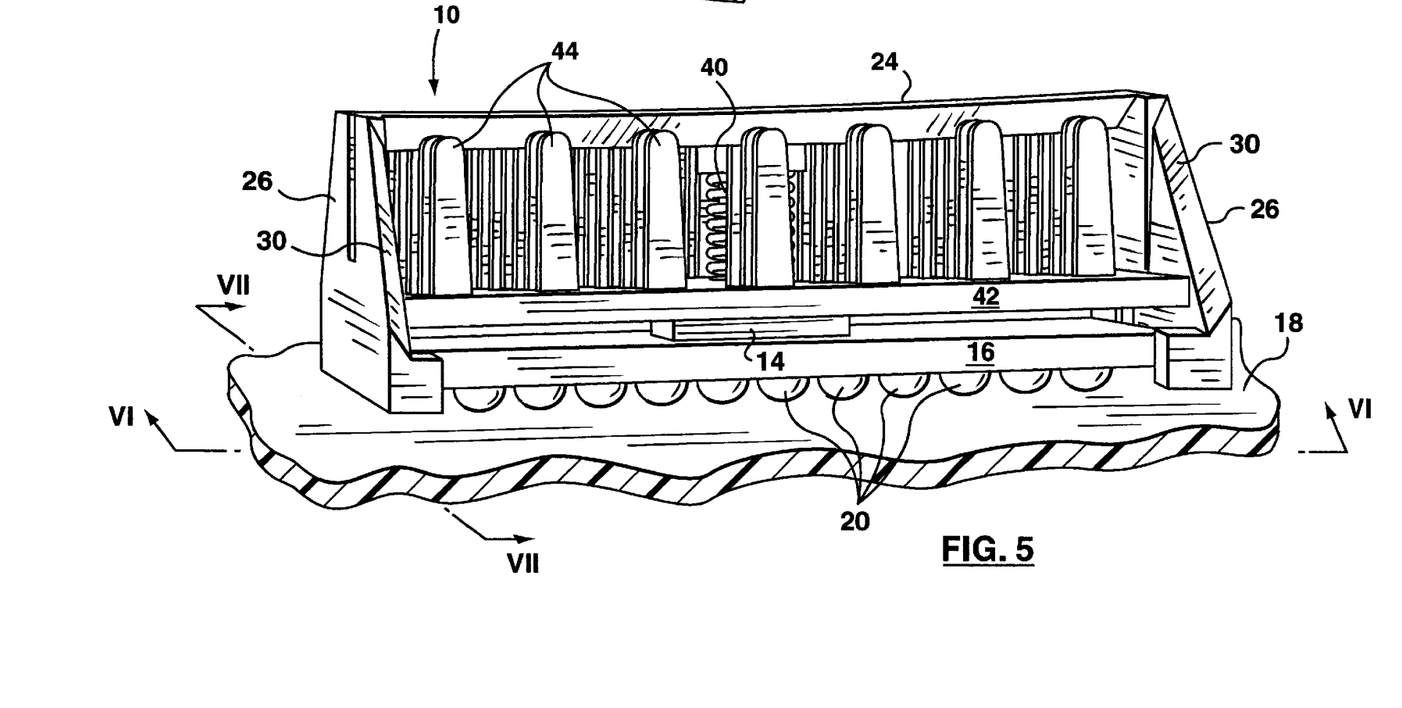
FIG. 5 is a partly isometric side elevational view of an assembly of the clip and heat sink of FIG. 1 together with the electronic component and substrate and printed circuit board of FIG. 2.

As shown in FIG. 1, a clip 10 according to the embodiment is provided for holding a heat sink 12 in heat conductive relationship with an electronic component which is in the form of an integrated circuit 14 (FIG. 2) mounted upon a rectangular substrate 16 forming part of circuitry together with the integrated circuit and together with a printed circuit board 18 upon which the substrate 16 is mounted. As shown more particularly in FIGS. 5 and 6 for instance, the undersurface of the substrate 16 carries a ball grid array 20 by which it is electrically connected to the printed circuit board.

The clip 10 comprises a plastic body 22 integrally formed from a polyethylerimide base material such as that sold under the Trade Name "Ultem". The body 22 comprises a resilient beam 24 for extending, in use, across the heat sink 12 as will be described. Two arms 26 of the body extend in opposition from ends of the resilient beam 24. Each arm is substantially planar in a plane normal to the longitudinal direction of the beam 24 and is tapered so as to be wider at a free end 28 than at its end fixed to the beam, the tapering being formed with inclined edges 30 of the arm. Thus, as will be seen, the width of the beam 24 is narrower than the heat sink 12 to which the clip 10 is to be fitted.

Figure 4:
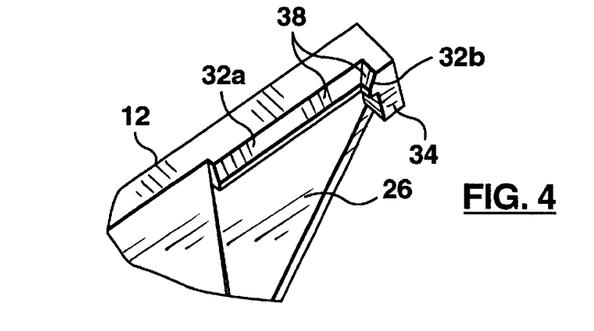
FIG. 4 is an underside isometric view of part of the clip of the embodiment, in the direction of arrow IV in FIG. 1.

The free end 28 of each arm is formed at sides of the arm with two opposing registration projections which extend inwardly towards the other arm for registration with one pair of opposite ends of the substrate 16 at corners of the substrate. These registration projections are formed by substantially rectangular flanges 34 which extend towards the beam 24. The free end 28 of each arm is provided also with two free end extensions 32. Each extension, which also extends inwardly towards the other arm is "L" shaped with a longer leg 32a of the "L" extending directly from the free end 28 and aligned, but spaced from, the longer leg of the other extension 32 of the same arm. A shorter leg 32b of each extension 32 extends from a flange 34 as shown basically in FIGS. 1 and 4. Each extension 32 is also provided with a camming surface for effecting movement apart of the free ends of the arms 26 to enable the heat sink and substrate 16 to pass between the extensions during assembly. This camming surface is provided by an inclined undersurface 38 of each extension 32, the inclined undersurface formed upon both short and long legs of the extension, as shown by FIG. 4.

Figure 1A:
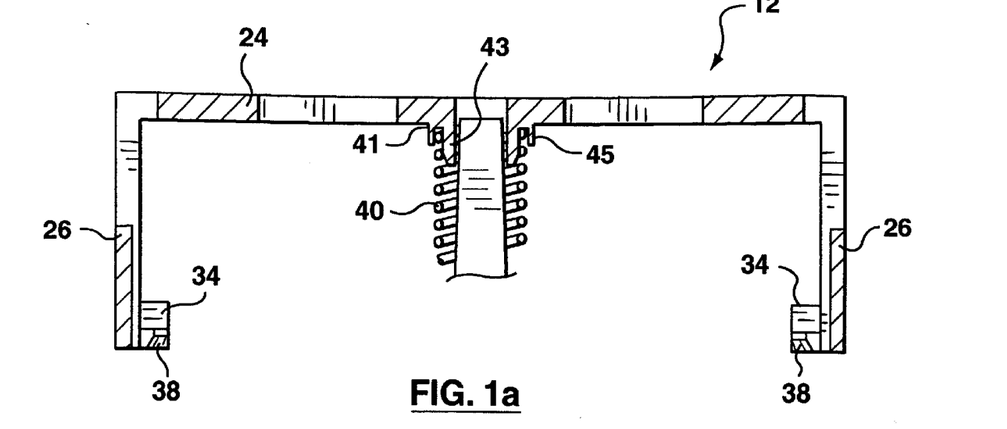
FIG. 1a is a scrap cross-sectional view of the partial assembly of the clip and heat sink taken along line 1a—1a in FIG. 1.

The clip 10 also comprises metal spring means in the form of a compression spring 40 (FIG. 1). A short spigot 41 on the underside of the beam has inner and outer annular walls 43 and 45 (FIG. 1a). The spring 40 is locatable in a mid position along the beam 24 with an upper end of the spring seated in an annular space between the annular walls 43 and 45 so as to extend downwardly between the arms 26.

The heat sink 12 has a base 42 and on one side of the base the heat sink has a plurality of rows of upwardly extending heat emitting projections in the form of pins 44, the pins having been formed by a machining operation or by a combination of extrusion and machining. The pins define between them cooling air flow passages 46.

To assemble the heat sink 12 and clip 10 onto the integrated circuit 14 and substrate 16, the clip is first located upon the heat sink with the upper end of the spring 40 received between annular walls 43 and 45 of the spigot as disclosed above. The position of the spigot 41 on the beam aligns the spring 40 around a centrally positioned pin 44 of the heat sink. As the clip 10 is lowered on to the heat sink, the inclined undersurfaces 38 of the extensions 32 engage the edges of the heat sink thereby camming the free ends of the arms 26 away from each other by outward pivoting of the arms as downward movement of the clip continues. Upon the extensions 32 passing below the lower surface of the heat sink 12, the arms 26 pivot inwardly due to the resilient nature of the clip 10 so that the extensions 32 pass beneath the heat sink so as to hold the heat sink and clip loosely assembled together.

The heat sink together with the clip is then located in position with the underside of the base 42 of the heat sink in heat conductive contact with the upper surface of the integrated circuit 14. As may be seen from FIGS. 5, 6 and 7 the base of the heat sink is of such size and shape that its edges are vertically aligned with edges of the substrate 16.

Figure 3:
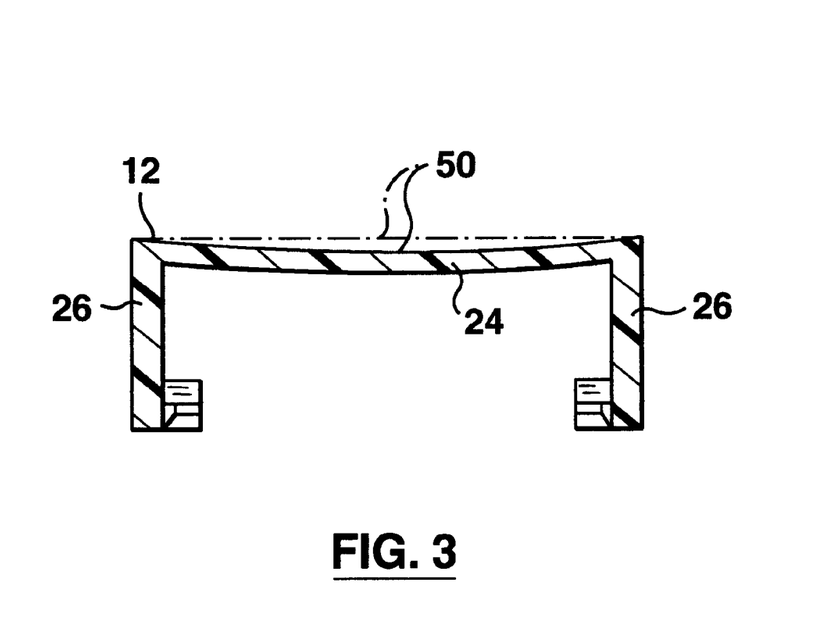
FIG. 3 is a cross-sectional view taken along line III—III of the clip in FIG. 1.

As may be seen from FIG. 3, in a normal unstrained position of the clip 10, an upper surface 50 of the resilient beam 24 is concave from end to end of the beam. This concavity is formed by a general curvature provided for the beam.

Figure 8:
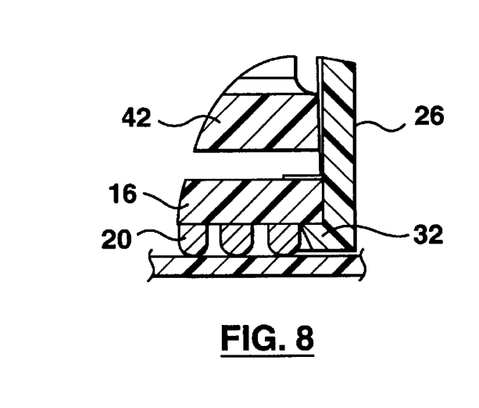
FIG. 8 is a cross-sectional view through part of the assembly and taken along line VIII—VIII in FIG. 7.

Downward movement of the clip 10 continues until the extensions 32 pass the edges and then below the substrate 16. This downward movement is accompanied by axial compression of the compression spring 40 between the spigot 41 and the base 42 of the heat sink. Upon the extensions reaching below the substrate, the arms pivot inwardly due partly to the resilient nature of the clip, but mainly because the beam 24 is flexed upwards due to the upward pressure of the compression spring 40 upon the beam 24. This inward movement of the arms causes the extensions 32 to move beneath the undersurface of the substrate 16 and towards each other to complete the assembly (FIG. 8). Downward movement of the clip is also accompanied by the sliding reception of the centrally positioned pin within the inner wall 43 of the spigot 41.

In the completed assembly, the spring 40 is compressed between the base 42 of the heat sink 12 and the underside of the beam 24. This holds the beam flexed upwardly in its central regions which tends to straighten the beam from its curved state shown in full outline in FIG. 3, towards or into its straight chaindotted position. In this resiliently flexed position, the upper surface of the beam does not extend upwardly beyond the ends of the beam from which the arms 26 extend so that the clip does not increase in height in its flexed condition. Also, flexing of the beam upwards holds the arms 26 inwards with the "L" shaped extensions 32 beneath the undersurface of the substrate. In the assembly, the substrate 16, integrated circuit 14 and the base 42 of the heat sink 12 are compressively held between upper surfaces of the extensions 32 and the lower end of the compression spring 40. The spring 40 thus holds the heat sink against the integrated circuit 14 in location along an axis extending normal to the base 42 of the heat sink. This produces a desired pressure between heat sink and integrated circuit for heat conductive purposes. The spigot 41 also registers the clip in position upon the heat sink by reception of the central pin 44 and upper end of the compression spring within the spigot. In this registered position, the heat sink 12 and clip 10 are relatively located along two horizontal axes (i.e. parallel to the base 42 of the heat sink). The engagement of the arms 26 with opposite edges of the heat sink prevent rotation of the clip IO upon the heat sink around the common axis of the spigot 41 and central pin 44. The registration flanges 34 of each arm 26 register the clip 10 in position along one horizontal axis upon the substrate 16 by engagement of the flanges with one pair of opposite edges of the substrate. The arms 26 in being held inwards towards one another by the upwardly deflected beam 24, register the clip in position in another horizontal axis by engagement with a second pair of opposite edges of the substrate. As the heat sink and clip are also relatively located and held in position along the two horizontal axes, then the heat sink is thus also located correctly in its desired position in these two horizontal axes upon the integrated circuit 14 for heat removal purposes.

Figure 9:
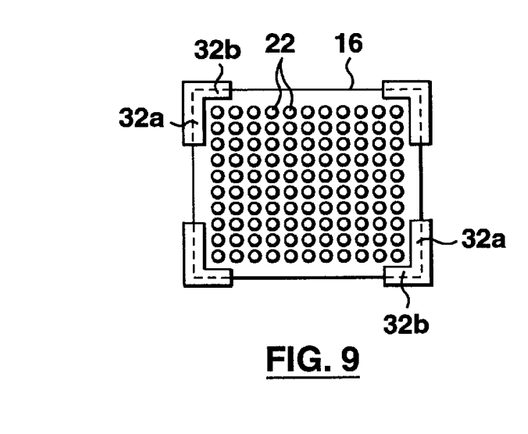
FIG. 9 is an underside view in the direction of arrow IX in FIG. 6 with the printed circuit board omitted for clarity.

In use, the "L" shaped extensions 32 engage the undersurface of the substrate 16 in two directions away from each corner of the substrate (see FIG. 9) and serve to stabilize the arms 26 in position against dislodgement in any direction such as caused by vibration.

Figure 6:
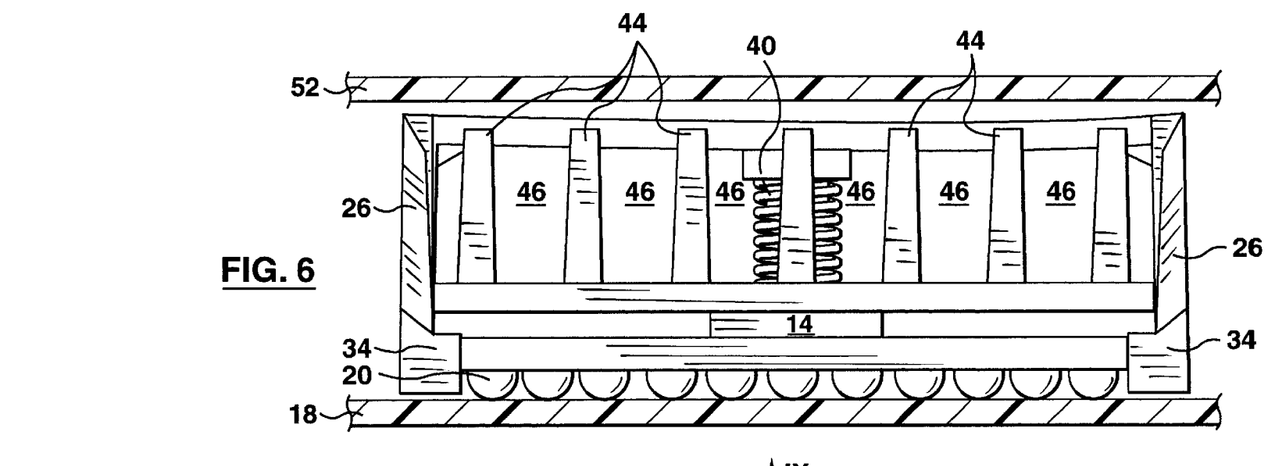
FIG. 6 is an cross-sectional view along line VI—VI in FIG. 5.
Figure 7:
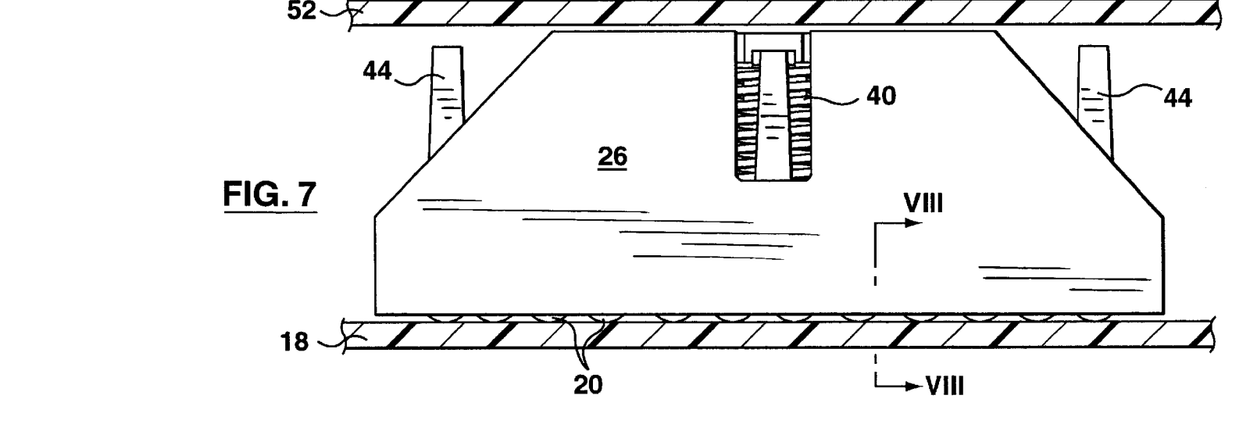
FIG. 7 is a cross-sectional view along line VII—VII in FIG. 5.

The positioning of the compression spring 40 between the base 42 of the heat sink and the beam 24 ensures that the maximum height of the clip 10 is set by the position of the beam. Because the beam may be located substantially no further from the base 42 than the free ends of the heat exchange pins 44, then the clip 10 does not add unduly to the assembled height of the substrate 16, integrated circuit 14 and the heat sink 12. It is hence found that the total assembly including the clip may be constructed with a height which fits comfortably within a gap of 9 mm to 10 mm between adjacent printed circuit boards. FIGS. 6 and 7 show the assembly mounted upon its own printed circuit board 18 and located between this printed circuit board and an adjacent printed circuit board 52. There is a maximum gap of about 10 mm between the boards such as may occur when printed circuit boards are mounted within a shelf of electronic equipment.

In addition, because the beam 24 is the outermost part of the clip in the assembly, it may be positioned outwardly beyond the free ends of the heat exchange pins 44 or may obscure only their extremities. This is the situation shown in the Figures wherein the beam 24 is formed with slots 54 to allow the pin extremities to enter the slots should they need to do so. Thus the most effective heat exchange parts of the pins 44, i.e. which lie inwards from the extremities towards the base 42, are not obscured. As a result, the air flow passages 46 between the pins are not partially blocked. Thus the clip has negligible or no effect upon the flow of cooling air through the passages 46. In fact the opposite is true.

The beam 24 and the base 42 of the heat sink form sides for the air flow passages 46 and promote funnelling of the air through the passages for heat removal. This funnelling is encouraged by shaping leading edges of the beam 24 and arms 26 to appropriately direct the air. This shaping is in the form of an inward inclination of the edges 30 of the arms and beam as shown by the Figures. In addition, any drag resistance to air flow is minimized by limiting the area of the arms and beam facing into the passages 46, i.e. by tapering the arms and minimizing the beam width.

The avoidance of the use of an attachment screw on the clip provides further advantages to those discussed above. Application of correct screw torque and problems of screw loosening, particularly under vibration, creep and temperature changes, are avoided. In contrast, in the invention as shown by the embodiment, the spring length and spring rate are preset for their use requirement and no loosening of the clip can occur. If there is creep in any of the materials of the assembly, or dimensional changes take place due to temperature changes and as the result of the effects of differential thermal coefficients of expansion, the spring will continuously act between the beam 24 and the base 42 to apply the required degree of compressive contact between the base and the integrated circuit 14 for the desired rate of heat removal. The spring is also unobtrusive in that, as in the embodiment, it may be located so as to provide negligible obstruction to air flow through the passages 46. As described, the spring is aligned with one row of pins 44.

Further advantages also accrue from use of the inventive clip. The beam 24 flexes to enable the arms to move apart and be applied directly on to the heat sink. Thus the printed circuit board does not require a clear space, i.e. one not containing conductors or circuitry, to one side of the substrate, as may be the case for use of a clip which would require lateral movement on to the heat sink. Also the clip is for use with a heat sink having optimized heat exchange area disposed solely over the plan area of the substrate as shown. The clip is conveniently designed so as to fit substantially over the plan area of the substrate with only a minimal thickness of each arm projecting over the boundary of the substrate. Also in the assembled position therefore, the clip does not overshadow any part of the printed circuit board 18. The clip is conveniently formed, as by molding, as an integral molded article. By its non-electrically conductive nature, particularly at its extensions 32, shorting between conductors of the substrate is prevented.

In a first modification of the embodiment, not shown, the heat sink 12 is formed instead by molding the base 42 with circular cross-section pins 44 upstanding from the base.

Figure 10:
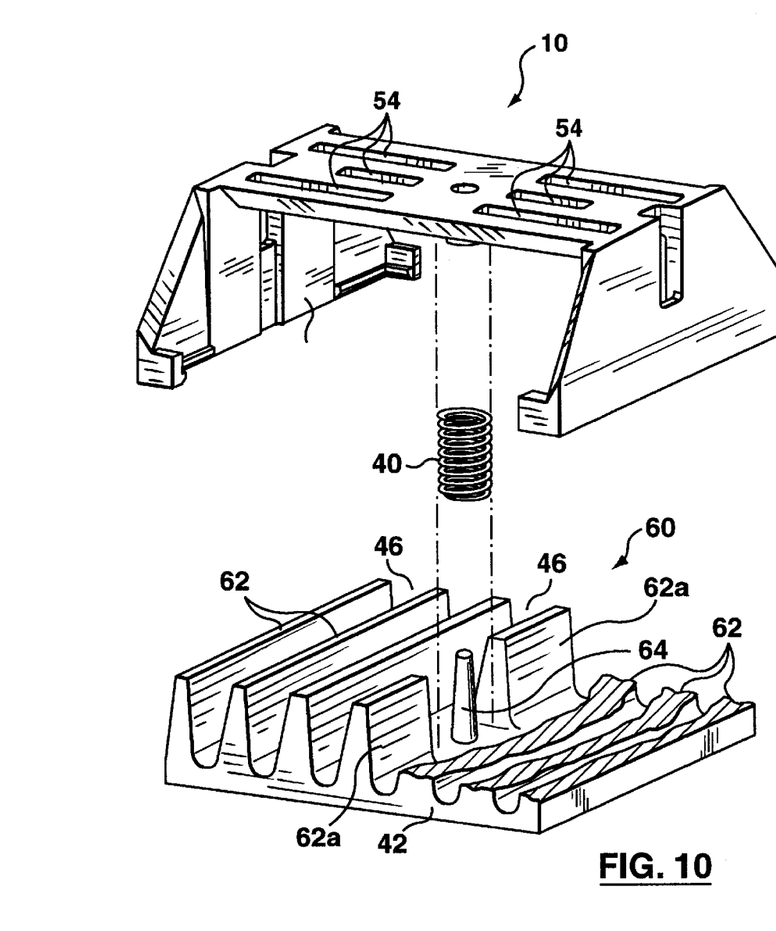
FIG. 10 is an isometric view of a heat sink for use in a modification of the assembly of FIG. 5.

In a second modification of the embodiment, as shown by FIG. 10, the clip is as described in the embodiment and the difference in the total structure is in the nature of the heat sink. In this modification a heat sink 60 has a base 42 and a plurality of parallel heat exchange fins 62 which define the air flow passages 46 between them. A centrally disposed fin is manufactured with two end portions 62a, the end portions being separated by a single pin 64 of the base which is positioned centrally of the base. This pin serves as a register for the compression spring 40 to register the position of the clip 10 upon the heat sink 60 in a manner similar to that described in the embodiment with regard to the heat sink 12.

As described in the above embodiment and modifications thereof, the compression spring 40 is used to register the clip 10 and heat sink 12 in position along two horizontal axes. Such, however, is not an essential requirement of the invention. A third modification, now to be described, shows that the spring 40 may register the clip and heat sink along one horizontal axis only while other means are used to register them along the other horizontal axis.

Figure 11:
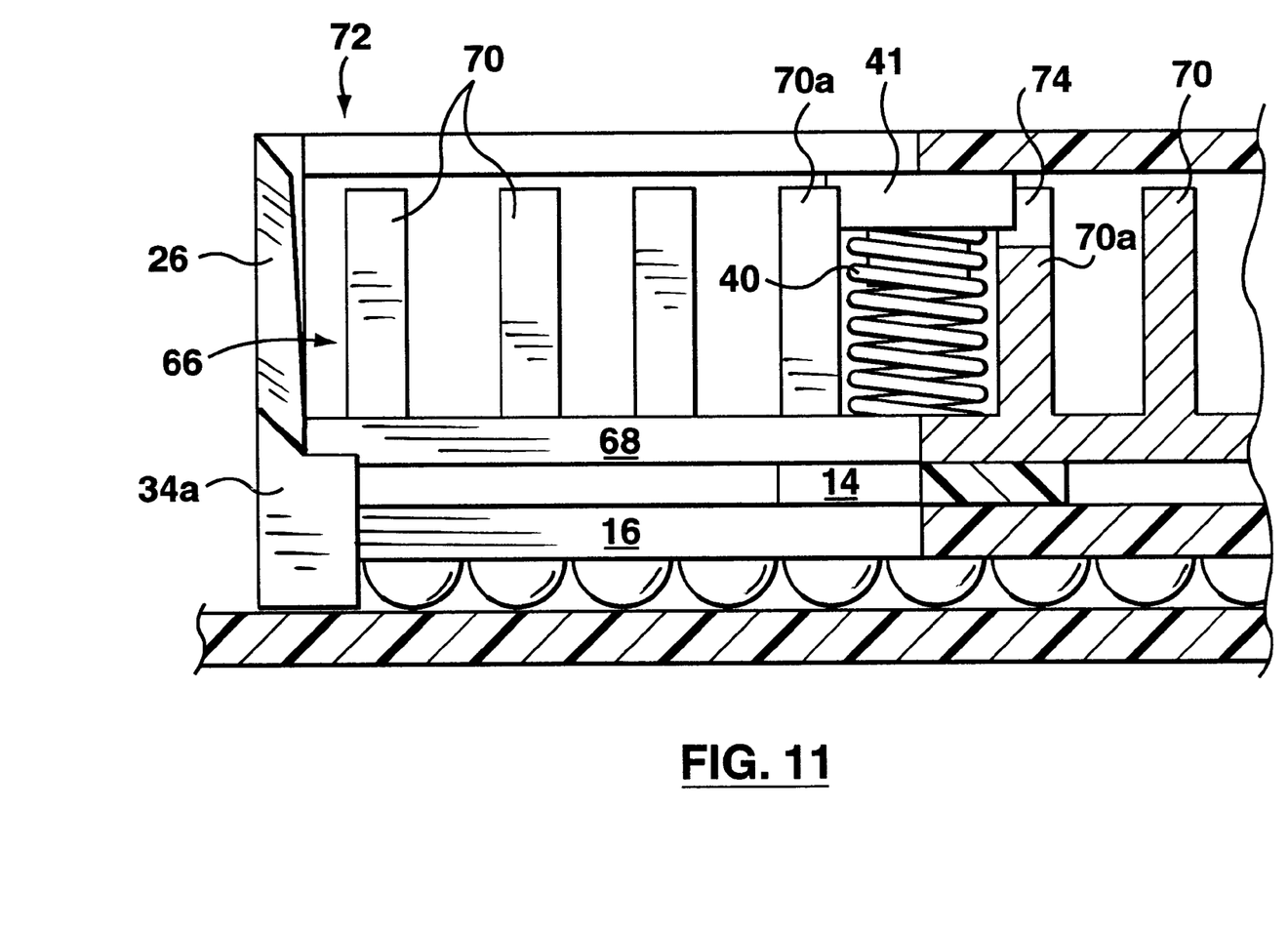
FIG. 11 is a side elevational view, in cross-section, of a further modification to the form of the assembly of FIG. 5.

Thus, in the third modification, as shown by FIG. 11, a heat sink 66 has a base 68, the base lying in heat conductive engagement with the integrated circuit 14 carried upon the substrate 16 as described above. The heat sink 66 has a plurality of heat exchange fins 70 extending in parallel in a direction normal to the plane of FIG. 11. These fins have parallel sides and are formed by machining. Two central fins 70a provide registration for the sides of the spring 40 so as to locate a clip 72 correctly in position upon the heat sink in the plane of FIG. 11. These two fins 70a replace the central pin 44 of the above described embodiment for this purpose. Each fin 70a is provided with a recess 74 in its central region to accommodate the spigot 41.

Hence, the spring 40 is only capable of registering the clip 72 upon the heat sink 44 in one horizontal direction, i.e. in the plane of FIG. 11. The clip 72 is basically of the construction of the clip 10. The clip 72 differs from the clip 10 in that it has on each of the arms 26 two rectangular flanges 34a in positions corresponding to the flanges 34 of the embodiment, these flanges 34a extending upwardly towards the beam 24 further than the flanges 34 in the embodiment. The flanges 34a extend upwardly as shown by FIG. 11, sufficiently far to overlap edges of the base 68 of the heat sink 66. Hence, the flanges 34a register not only the clip 72 upon the substrate 16, as described above, but also register the heat sink 66 relative to the clip and the substrate 16 in the plane extending normal to the plane of FIG. 11. Hence, the spring 40 and the flanges 34a serve in combination to register the clip, the heat sink and the substrate along both horizontal directions while the spring serves to register the assembly of the parts along the vertical plane, as described in the embodiment.

What is claimed is:

1. A clip for holding a heat sink in heat conductive relationship with an electronic component mounted upon a first side of a substrate, the clip comprising a clip body and spring means, the clip body comprising:
   a resilient beam for location in a position on one side of the heat sink; and
   two arms extending in opposition from the beam in spaced positions along the beam, each arm having a free end with an electrically non-conductive free end extension which extends towards the other arm;
   the clip body being resiliently flexible to move the free ends of the arms further apart for reception of the heat sink and the substrate between them and locate the free end extensions in positions opposing a second side of the substrate remote from the first side; and
   the spring means being operably engageable with the resilient beam in a position between the arms to act between the beam and a surface of the heat sink so as to resiliently flex the beam away from the heat sink and pivot the arms to move their free end extensions towards each other on the second side of the substrate to compressively hold the heat sink, electronic component and substrate between the spring means and the free end extensions of the arms.

2. A clip according to claim 1, wherein the spring means comprises at least one compression spring.

3. A clip according to claim 1, wherein a surface of the resilient beam which faces away from the arms is concave in an unstressed condition of the beam, resilient flexing of the beam under the influence of the spring means causing at least a reduction in concavity of the concave surface.

4. A clip according to claim 1, wherein the free end extensions of the arms have camming surfaces facing generally away from the resilient beam while being inclined towards each other from arm to arm for effecting movement apart of the free ends of the arms with camming action to accept the heat sink and substrate between them.

5. A clip according to claim 4, wherein each arm is planar in a plane normal to the length direction of the beam and each arm has side edges which are formed with opposing registration projections which extend towards the other arm, the registration projections provided to register with two opposite ends of the substrate for location purposes.

6. A clip according to claim 5, wherein each arm has a greater planar width at its free end than adjacent the resilient beam and the resilient beam is narrower than the free end of each arm.

7. A clip according to claim 1, wherein the spring means is a metal spring means.

8. A clip according to claim 1, wherein the free end extensions have electrically insulated surfaces.

9. In combination, a substrate, an electronic component mounted upon a first side of the substrate, a heat sink, and a clip for holding the heat sink in heat conductive relationship with the electronic component, wherein:
   the heat sink comprises a base and heat emitting projections extending from a first side of the base in spaced apart relationship to define cooling air passages between the projections; and
   the clip comprises a clip body and spring means, wherein the clip body comprises:
      a resilient beam for location in an assembly of said electronic component, substrate and heat sink, in a position spaced from the first side of the base of the heat sink with a second and remote side of the base in heat conductive relationship with the electronic component; and
      two arms extending in opposition from the beam in spaced positions along the beam, the arms each having a free end with a free end extension which extends towards the other arm;
      the beam being resiliently flexible to move the free ends of the arms further apart for reception of the heat sink and substrate between them and locate the free end extensions engaging a second side of the substrate remote from the first side of the substrate; and
      the spring means operably engageable in a position between the arms to act between the beam and the first side of the base so as to resiliently flex the beam away from the heat sink to pivot the arms and move their free end extensions towards each other on the second side of the substrate to compressively hold the heat sink, electronic component and substrate between the spring means and the free end extensions of the arms.

10. A combination according to claim 9, wherein the spring means comprises at least one compression spring.

11. A combination according to claim 10, wherein the compression spring is locatable between the beam and the heat sink in a position so as not to obscure a cooling air passage.

12. A combination according to claim 11, wherein the beam and heat sink each has registration means for the compression spring to register the heat sink with the clip body.

13. A combination according to claim 12, wherein the heat sink comprises a heat emitting projection which provides the registration means of the heat sink, the projection being axially receivable within the compression spring.

14. A combination according to claim 9, wherein the free end extensions of the arms have camming surfaces facing generally away from the resilient beam while being inclined towards each other from arm to arm for effecting movement apart of the free ends of the arms with camming action to accept the heat sink and substrate between them.

15. A combination according to claim 14, wherein the free end of the arms are registrable with one pair of opposing edges of the substrate to register the clip body upon the substrate in one direction, and registration means is provided to register the clip body relative to the heat sink whereby the heat sink is registrable in position upon the electronic component.

16. A combination according to claim 15, wherein each arm is planar in a plane normal to the length direction of the beam and each arm has side edges which are formed with opposing registration projections which extend towards the other arm, the registration projections provided to register the clip body upon the substrate in another direction.

17. A combination according to claim 16, wherein each of the opposing registration projections includes an extension which extends from the projection across the respective arm so as to engage the second side of the substrate when the free end extensions of the walls engage the second side of the substrate.

18. A combination according to claim 16, wherein each arm has a greater planar width at its free end than adjacent the resilient beam and the resilient beam is narrower than the free end of each arm.

19. A combination according to claim 9, wherein a surface of the resilient beam which faces away from the arms is concave in an unstressed condition of the beam, resilient flexing of the beam under the influence of the spring means causing at least a reduction in concavity in the concave surface.

20. A combination according to claim 9, wherein in the assembly, the flexible beam, in flexed condition, is disposed outwardly of the base beyond free ends of the heat emitting projections.

21. A combination according to claim 9, wherein the beam is formed with apertures for receiving free ends of the heat emitting projections.

22. A combination according to claim 9, wherein the beam is positioned, in the assembly, at least as far as free end regions of the heat emitting projections, away from the base of the heat sink, the beam, the base and the arms serving to funnel cooling air along the cooling air passages between the projections, and leading edges of the beam and of the arms, in the sense of direction of movement of cooling air are appropriately oriented to direct the air into the air passages.

23. A clip for holding a heat sink in heat conductive relationship with an electronic component mounted upon a first side of a substrate, the clip comprising a clip body and metal spring means, the clip body comprising:

a resilient beam for location in a position on one side of the heat sink; and two arms extending in opposition from the beam in spaced positions along the beam, each arm having a free end with an electrically non-conductive free end extension which extends towards the other arm;

the clip body being resiliently flexible to move the free ends of the arms further apart for reception of the heat sink and the substrate between them and locate the free end extensions in positions opposing a second side of the substrate remote from the first side; and the metal spring means being operably engageable with the resilient beam in a position between the arms to act between the beam and a surface of the heat sink so as to resiliently flex the beam away from the heat sink and pivot the arms to move their free end extensions towards each other on the second side of the substrate to compressively hold the heat sink, electronic component and substrate between the spring means and the free end extensions of the arms.

* * * * *

UNITED STATES PATENT AND TRADEMARK OFFICE
CERTIFICATE OF CORRECTION

PATENT NO. : 6,462,951 B2
DATED : October 8, 2002
INVENTOR(S) : Fabien Letourneau It is certified that error appears in the above-identified patent and that said Letters Patent is hereby corrected as shown below:

<u>Title page,</u>
Item [73], Assignee, should read as follows:
-- [73] Assignee: Alcatel Canada Inc., Kanata (CA) --.

Signed and Sealed this

Eighteenth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,462,951 B2
DATED : October 8, 2002
INVENTOR(S) : Letourneau, Fabien It is certified that error appears in the above-identified patent and that said Letters Patent is hereby corrected as shown below:

<u>Title page,</u>
Item [73], Assignee, replace "Alcatal" with -- Alcatel --.

Signed and Sealed this

Eighth Day of April, 2003

JAMES E. ROGAN
*Director of the United States Patent and Trademark Office*